United States Patent
Ali et al.

(10) Patent No.: US 9,137,082 B1
(45) Date of Patent: Sep. 15, 2015

(54) SYSTEM AND METHOD FOR JOINT COMPENSATION OF POWER AMPLIFIER'S DISTORTION

(71) Applicants: KING FAHD UNIVERSITY OF PETROLEUM AND MINERALS, Dhahran (SA); KING ABDULAZIZ CITY FOR SCIENCE AND TECHNOLOGY, Riyadh (SA)

(72) Inventors: Anum Ali, Islamabad (PK); Damilola Sadiq Owodunni, Ikosa Gra (NG); Oualid Hammi, Dhahran (SA); Tareq Yousef Al-Naffouri, Dhahran (SA)

(73) Assignees: KING FAHD UNIVERSITY OF PETROLEUM AND MINERALS, Dhahran (SA); KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 0 days.

(21) Appl. No.: 14/192,729

(22) Filed: Feb. 27, 2014

(51) Int. Cl.
*H03H 7/30* (2006.01)
*H04L 27/26* (2006.01)
*H04L 1/00* (2006.01)
*H04L 25/03* (2006.01)

(52) U.S. Cl.
CPC .......... *H04L 27/2646* (2013.01); *H04L 1/0001* (2013.01); *H04L 25/03114* (2013.01); *H04L 2025/03414* (2013.01)

(58) Field of Classification Search
CPC .............. H04L 27/2646; H04L 1/0001; H04L 25/03114; H04L 2025/03414; H04L 25/03038; H04L 25/03019; H04L 25/03057; H04L 1/0057; G11B 20/10009

USPC ......................................................... 375/230
See application file for complete search history.

(56) References Cited

U.S. PATENT DOCUMENTS

| | | | |
|---|---|---|---|
| 7,904,033 | B1 | 3/2011 | Wright et al. |
| 7,961,045 | B2 | 6/2011 | Morris et al. |
| 8,170,516 | B2 | 5/2012 | Dehos et al. |
| 8,396,149 | B1 | 3/2013 | Zortea et al. |
| 2003/0042978 | A1 | 3/2003 | Hsu et al. |
| 2009/0163143 | A1 | 6/2009 | De Rore |
| 2011/0122930 | A1* | 5/2011 | Al-Naffouri et al. .......... 375/219 |
| 2011/0135036 | A1 | 6/2011 | Andgart et al. |
| 2011/0270590 | A1* | 11/2011 | Aparin et al. ...................... 703/2 |
| 2013/0259153 | A1 | 10/2013 | Varanese et al. |

OTHER PUBLICATIONS

Owodunni, "Compressed Sensing Based Techniques for Estimation and Cancelation of Transmitters Nonlinear Distortions in OFDM Systems" Nov. 7, 2013.*

(Continued)

*Primary Examiner* — Juan A Torres
(74) *Attorney, Agent, or Firm* — Richard C. Litman

(57) ABSTRACT

The system and method for joint compensation of power amplifier's distortion provides a linearization scheme for transmitter power amplifiers driven by orthogonal frequency division multiplexing signals. A pre-compensated over-driven amplifier is employed at the transmitter. The over-driven amplifier's distortions are considered as a sparse phenomenon and compressive sensing (CS) algorithms are employed at the receiver to estimate and compensate for these distortions. A bandwidth efficient data aided scheme which does not require reserving subcarriers specifically for CS measurements is utilized.

9 Claims, 9 Drawing Sheets

(56) References Cited

OTHER PUBLICATIONS

Al-Rabah, "Receiver-Based Bayesian PAPR Reduction in OFDM" European Signal Processing Conference (EUSIPCO); Sep. 9, 2013.*
Anum, "Compressed Sensing Based Joint-Compensation of Power Amplifier's Distortions in OFDMA Cognitive Radio Systems." Dec. 2013: pp. 508-520.*
Al-Safadi, "Pilotless recovery of clipped OFDM signals by compressive sensing over reliable data carriers." IEEE 13th International Workshop on Signal Processing Advances in Wireless Communications (SPAWC), Jun. 17, 2012 IEEE, 2012.*
Al-Safadi, Peak Reduction and Clipping Mitigation in OFDM by Augmented Compressive Sensing, IEEE Transactions on Signal Processing, IEEE Transactions on vol. 60, Issue: 7 Jul. 2012, pp. 3834-3839.*
Mohammadnia, "Compressive sensing recovery of nonlinearly distorted OFDM signals." 2011 IEEE International Conference on Communications (ICC), IEEE, 2011.*
Al-Safadi, "Peak Reduction and Clipping Mitigation by Compressive Sensing", Jan. 22, 2011.*
Owodunni, "Compressed sensing techniques for receiver based post-compensation of transmitter's nonlinear distortions in OFDM systems" Available online Nov. 14, 2013.*
Al-Safadi, "On Reducing the Complexity of Tone-Reservation Based PAPR Reduction Schemes by Compressive Sensing" Global Telecommunications Conference, 2009 GLOBECOM 2009. Year: Nov. 30, 2009, pp. 1-6.*

\* cited by examiner

SYSTEM AND METHOD FOR JOINT COMPENSATION OF POWER AMPLIFIER'S DISTORTION

BACKGROUND OF THE INVENTION

1. Field of the Invention

The present invention relates to telecommunication systems, and particularly to a system and method for joint compensation of power amplifier's distortion in an orthogonal frequency division multiplexing (OFDM) telecommunication system.

2. Description of the Related Art

Emerging communication systems intensively use orthogonal frequency division multiplexing (OFDM) technique due to its numerous advantages such as high spectral efficiency, robustness to frequency selective fading, etc, which make it very attractive for the majority of communication systems. However, OFDM signals often result in time-domain wave-forms that have peak to average power ratio (PAPR) of up to 10 dB. These amplitude modulated signals are sensitive to the nonlinear distortions caused by the radio frequency (RF) power amplifier (PA) of the RF front-end. Indeed, the PA needs to linearly amplify the amplitude-modulated signals to avoid high error vector magnitude (EVM) and symbol error rate (SER) which will translate into loss of the information. Simultaneously, the power efficiency of the PA needs to be maximized since the amplifier consumes most of the power in the RF front-end. However, power amplifiers have low power efficiency when they are operated in their linear region, and their efficiency increases as they are driven into the nonlinear region close to saturation. Practically, power amplifiers are operated in their nonlinear region for power efficiency considerations. Then, the linearity is restored by means of system level architectures and mainly linearization techniques such as digital predistortion and feedforward implemented at the transmitter side.

Linearization techniques have been widely used to compensate for the PA's nonlinear distortions at the transmitter side. This is mainly motivated by the regulatory spectrum emission mask requirements in the licensed spectrum bands used for cellular communications and TV broadcasting. In fact, all these applications require that the spectrum at the output of the amplifier meets stringent linearity mask in order to avoid interference with adjacent channels. Among the various linearization techniques, digital predistortion is commonly used. It consists of applying a complementary nonlinearity (predistorter) before the non-linear PA such that the cascade of the predistorter and the amplifier behaves as a linear amplification system. Yet there remains the motivation to find a method for a more power efficient operation of digitally predistorted power amplifiers that maintains spectral efficiency by using a low number of pilot carriers.

Thus, a system and method for joint compensation of power amplifier's distortion solving the aforementioned problems is desired.

SUMMARY OF THE INVENTION

The system and method for joint compensation of power amplifier's distortion provides a linearization scheme for transmitter power amplifiers driven by orthogonal frequency division multiplexing signals. A pre-compensated over-driven amplifier is employed at the transmitter. The over-driven amplifier's distortions are considered as a sparse phenomenon and compressive sensing (CS) algorithms are employed at the receiver to estimate and compensate for these distortions. A bandwidth efficient data aided scheme which does not require reserving subcarriers specifically for CS measurements is utilized.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

At the outset, it should be understood by one of ordinary skill in the art that embodiments of the present method can comprise software or firmware code executing on a computer, a microcontroller, a microprocessor, or a DSP processor; state machines implemented in application specific or programmable logic; or numerous other forms without departing from the spirit and scope of the method described herein. The present method can be provided as a computer program, which includes a non-transitory machine-readable medium having stored thereon instructions that can be used to program a computer (or other electronic devices) to perform processes according to the method. The machine-readable medium can include, but is not limited to, floppy diskettes, optical disks, CD-ROMs, and magneto-optical disks, ROMs, RAMs, EPROMs, EEPROMs, magnetic or optical cards, flash memory, or other type of non-transitory, media or machine-readable medium suitable for storing electronic instructions.

The system and method for joint compensation of power amplifier's distortion provides a linearization scheme for transmitter power amplifiers (PAs) driven by orthogonal frequency division multiplexing signals. A pre-compensated over-driven amplifier is employed at the transmitter. The over-driven amplifier's distortions are considered as a sparse phenomenon and compressive sensing (CS) algorithms are employed at the receiver to estimate and compensate for these distortions. A bandwidth efficient data aided scheme which does not require reserving subcarriers specifically for CS measurements is utilized.

In the present power amplifier distortions' joint compensation method, the PA is first linearized using, for example, a digital pre-distorter, and then over-driven for power efficiency. The distortion caused by the over-driven linearized PA is modeled as a sparse phenomenon recovered at the receiver.

Recently, there has been an increased interest in the recovery of sparse signals using compressive sensing (CS). The significance of CS lies in the fact that it can reconstruct a sparse signal by utilizing a few linear projections over a basis that is incoherent with the basis in which the signal is sparse. Thus, CS can be applied to recover and then compensate for these distortions using a few frequency-domain data-free or pilot carriers. The use of a data-aided technique along with CS can further improve bandwidth efficiency by alleviating the need for frequency-domain free carriers. In such a case, the over-driven amplifier's distortions can be mitigated without using any frequency-domain free carriers. This will circumvent the bandwidth limitation of conventional CS techniques that require free carriers in order to estimate the over-drive distortions.

Figure 1A:
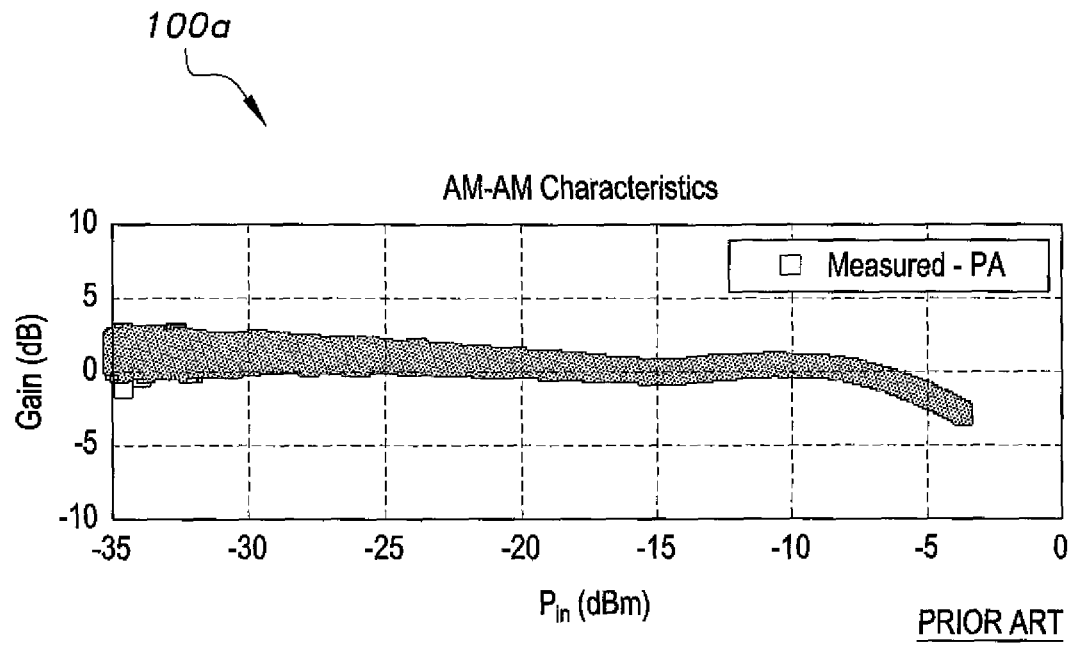
FIG. 1A is a plot of typical AM-AM characteristics of a power amplifier (PA) according to the present invention.
Figure 1B:
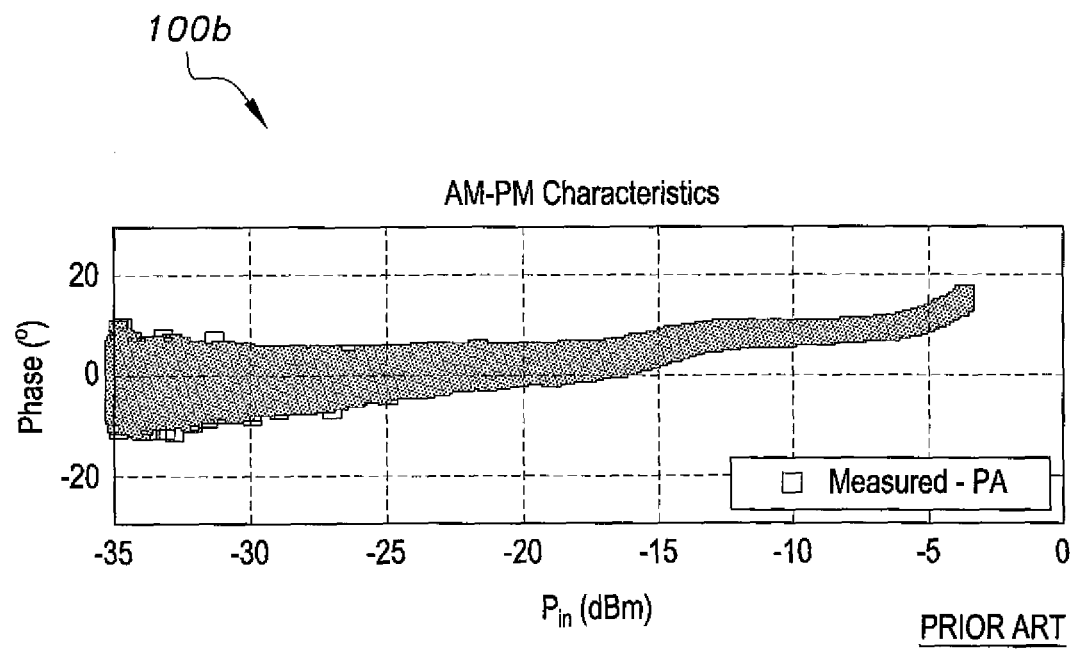
FIG. 1B is a plot of typical AM-PM characteristics of a PA according to the present invention.

The AM-AM and AM-PM characteristics of a typical PA are nonlinear. As an example consider the characteristics shown in FIG. 1A and FIG. 1B. As can be seen from the AM-AM curve 100a of FIG. 1A, the amplitude response is nonlinear, especially for high amplitude input signals, resulting in severe nonlinear distortion on the peaks. Furthermore, as shown in the AM-PM curve 100b of FIG. 1B the phase response is also nonlinear.

Figure 2A:
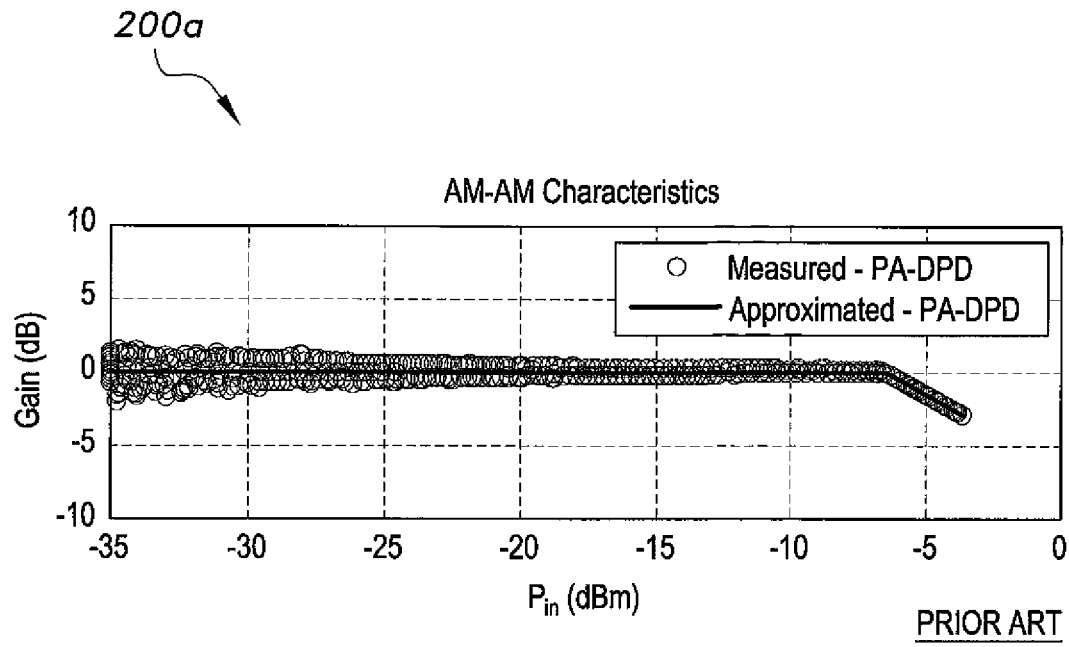
FIG. 2A is a plot showing measured vs. approximated AM-AM characteristics of a PA linearized using digital predistortion according to the present invention.
Figure 2B:
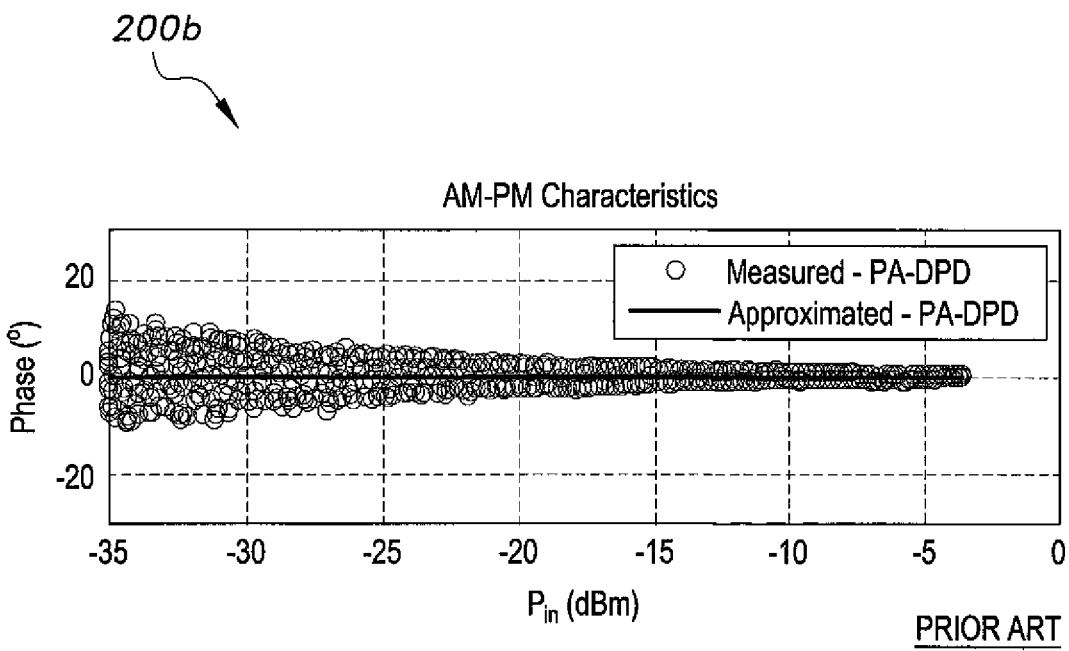
FIG. 2B is a plot showing measured vs. approximated AM-PM characteristics of a PA linearized using digital predistortion according to the present invention.

A linear amplification system may be obtained by using the cascade of a nonlinear PA and a digital pre-distortion (DPD) circuit matched to the characteristics of the PA. The measured AM-AM characteristics 200a of the linearized amplifier are shown in FIG. 2A. It is apparent, that the DPD-PA cascade has a constant gain response to a point where the amplifier saturates, and starts compressing. In the saturation region, the gain of the DPD-PA combination decreases linearly with increasing input power. However, AM-PM measured characteristics 200b shown in FIG. 2B reveals that the phase response of the linearized PA is constant throughout the range of interest. To simulate the DPD-PA, a look-up table (LUT) behavioral model, derived from the measured AM-AM and AM-PM characteristics of the linearized PA, using an exponential moving average algorithm is adopted in this work. The characteristics of the linearized amplifier based on the LUT model are also shown in FIGS. 2A and 2B. For any linear amplification system if the characteristics of DPD match closely with that of the PA, a system having the characteristics such as shown in FIGS. 2A and 2B results.

Figure 3:
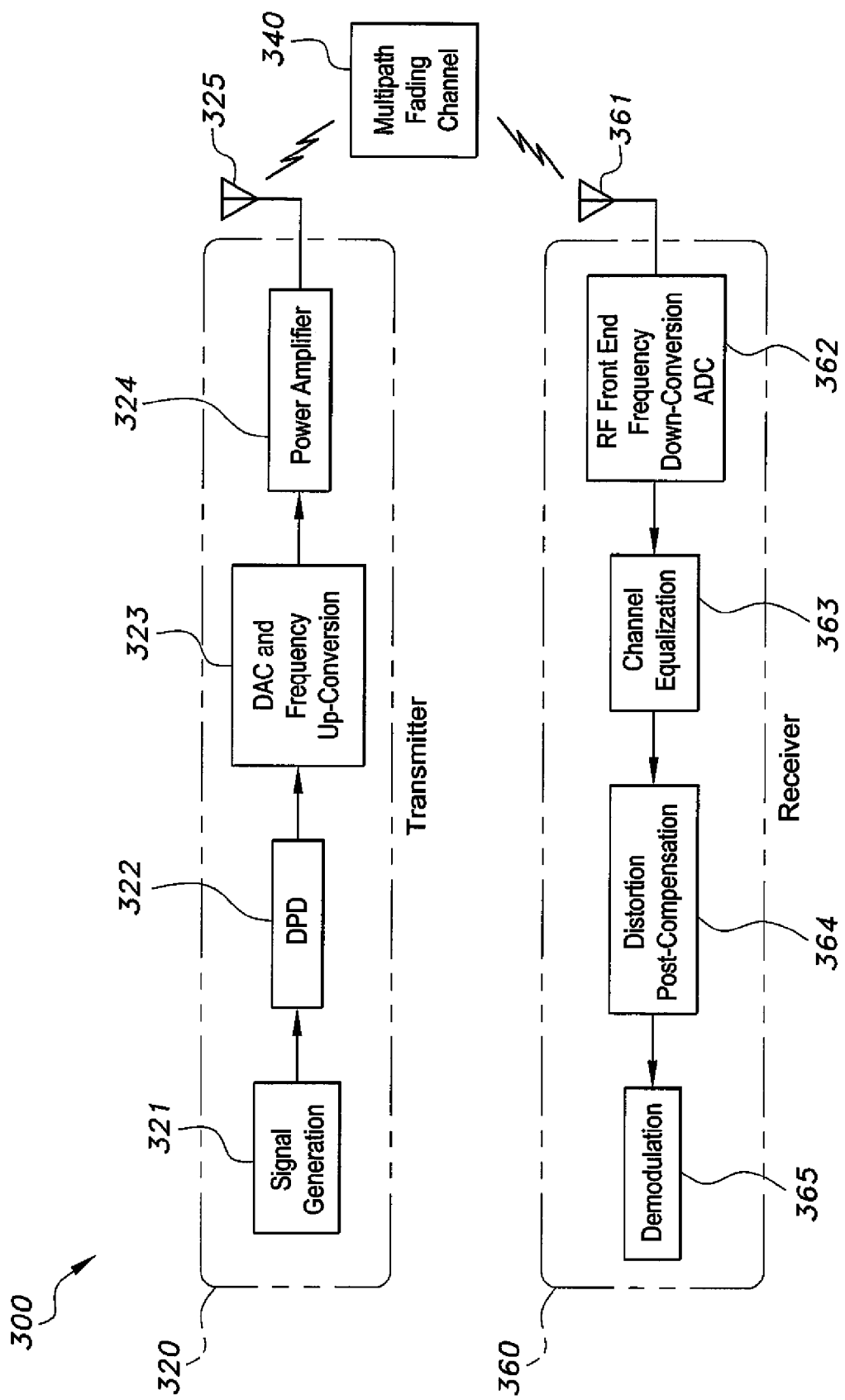
FIG. 3 is a block diagram of a communication system according to the present invention.
Figure 4:
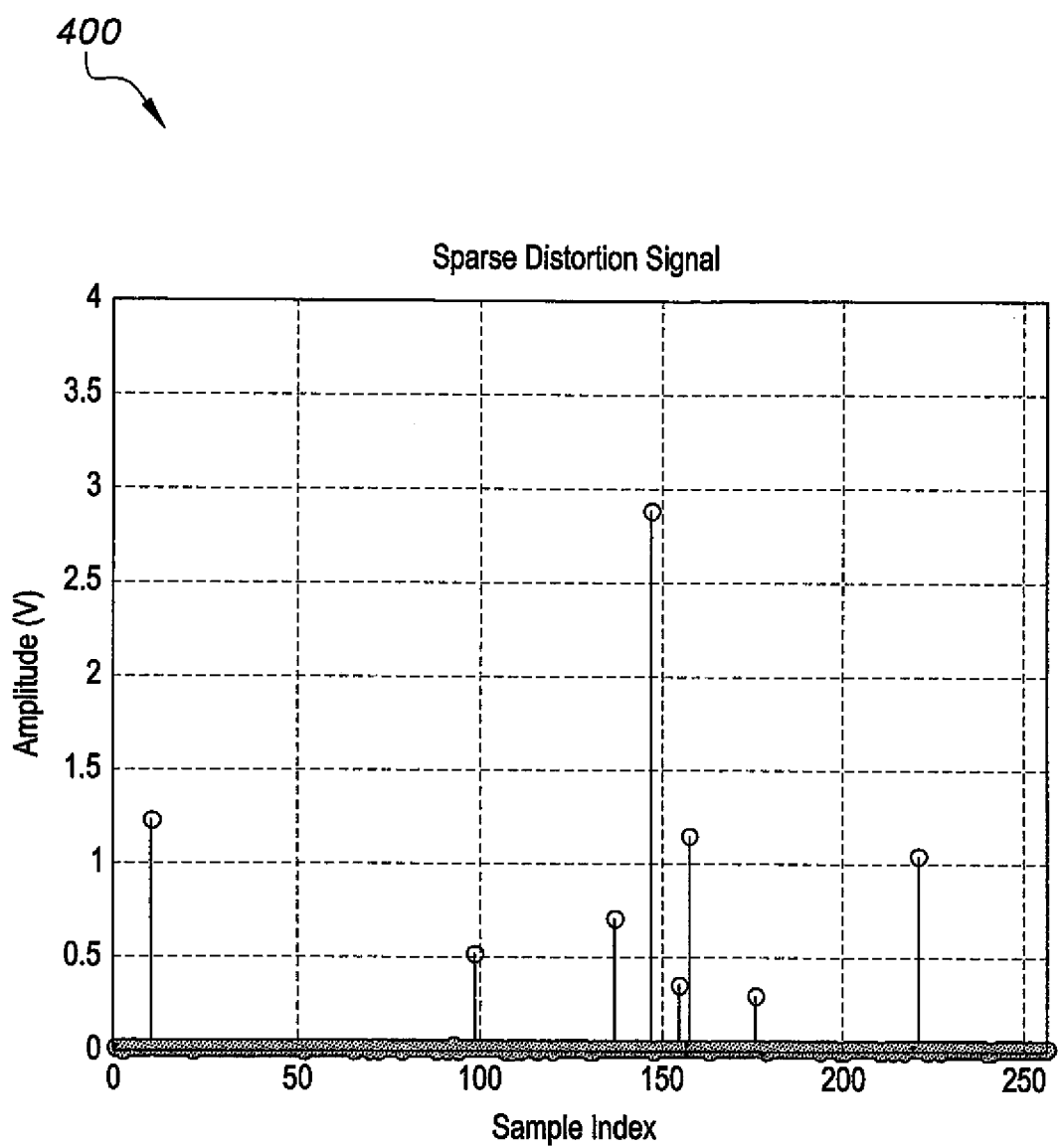
FIG. 4 is a plot of a sparse distortion signal caused by the overdriven PA linearized using digital predistortion according to the present invention.

The block diagram of communication system 300 with an overdriven jointly-compensated PA 324 is shown in FIG. 3. The exemplary communication system 300 has a transmitter 320 with a signal generation block 321 feeding the DPD 322 which feeds a digital to analog converter and a frequency up-converter 323 which drives power amplifier 324. The amplified signal that is transmitted by the antenna 325 propagates through a multipath fading channel 340 before being processed at a receiver 360 where an antenna 361 receives the signal and feeds it to an RF front end 362 where frequency down conversion and analog to digital conversion occur and feeds a channel equalization block 363. Output of the channel equalization block feeds a distortion post-compensation block 364 which then feeds a demodulation block 365. As shown in plot 400 of FIG. 4, the distortions from the over-driven linearized PA are sparse.

With reference to OFDM transmitter with linearized PA 500, the serial stream of data d to be transmitted is divided into N parallel streams that are modulated using either phase-shift keying (PSK) or quadrature amplitude modulation (QAM) to obtain a set of N data symbols, $X=[X(0)\ X(1)\ \ldots\ X(N-1)]$. This process occurs in the modulation and free-carrier insertion block 510. The time-domain signal that serves as an input to the linearized PA (DPD-PA) is obtained by performing an inverse discrete Fourier transform (IDFT) operation on X in the IDFT block 520. This operation is characterized by the relations, $$x = F^H X \qquad (1)$$

where F denotes the unitary discrete Fourier transform (DFT) matrix with (a, b) element, $$F_{a,b} = \frac{1}{\sqrt{N}} e^{-j2\pi ab/N}, \quad a, b \in \{1, 2, \cdots, N-1\}. \qquad (2)$$

Figure 5:
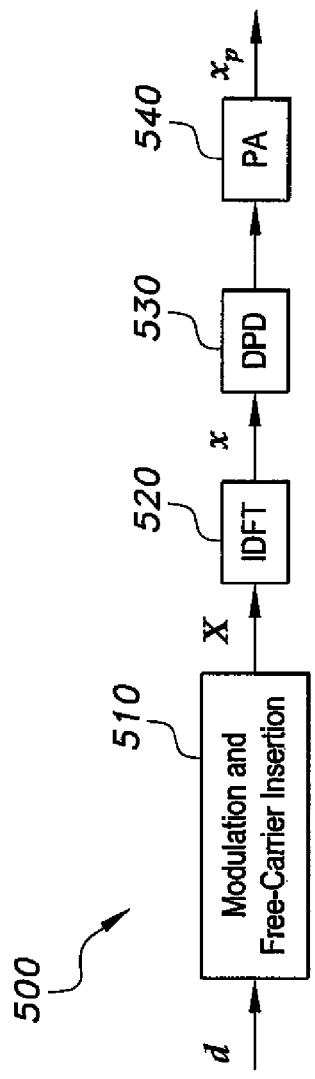
FIG. 5 is a simplified block diagram of a transmission system according to the present invention.

Furthermore in OFDM systems, a cyclic prefix is appended to x to avoid inter-symbol interference. This signal then passes through the DPD-PA combination before transmission. The DPD module 530 is inserted before PA 540 to synthesize a linear amplification system. In FIG. 5, the DAC and frequency up conversion module 323 of FIG. 3 is not reported for simplicity. The time domain signal that passes through a linear amplification system that is not over-driven will go undistorted. However, the amplifier over-drive will result in a distorted transmitted signal. This distortion can be modeled as addition of a distortion signal $x_d$ to the transmission signal. Hence the output of the PA can be written as, $$x_p = x + x_d. \qquad (3)$$

Figure 6:
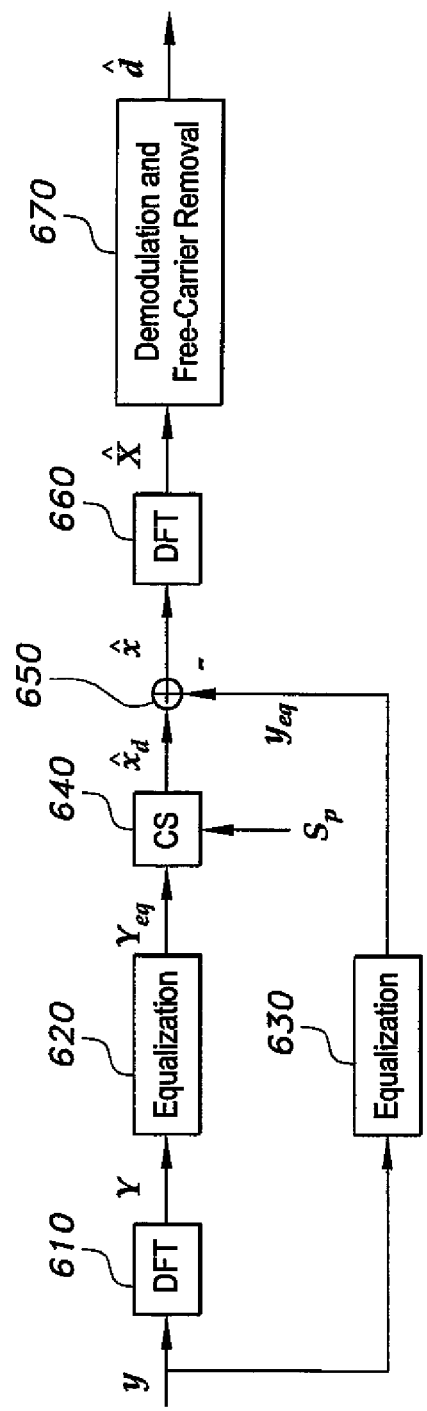
FIG. 6 is a simplified block diagram of a receiving system according to the present invention.

Here, the small signal gain of the PA is taken to be unity for simplicity, as it doesn't affect the generality of the system model. Since the main focus of this work is to study the effects of the PA's distortions, the transmitter's RF front end is considered to be ideal except for the nonlinear distortions generated by the amplifier. Thus the transmitter's RF front end is modeled using the baseband equivalent behavioral model of the PA. To take into consideration the presence of the DPD module in the baseband processing unit, while using a realistic model based on the measured data of the linearized PA, the DPD-PA combination 530 and 540 is simulated using the LUT synthesized from the measured data presented in the plots of FIGS. 2A-2B. The time-domain received signal is modeled as $$y = Hx_p + z. \qquad (4)$$

where $y \in \mathbb{C}^N$ is the time-domain received OFDM symbol (after removing the cyclic prefix) and z is the circular complex additive white Gaussian noise (AWGN), $z \sim \mathcal{CN}(0, \sigma_z^2 I)$, where $\sigma_z^2$ is the variance of noise samples. In OFDM systems, the linear convolution between the transmitted data, $x_p$, and the channel impulse response (CIR), $h=[h(0)\ h(1)\ \ldots\ h(N-1)]$ is converted into a cyclic convolution due to the presence of the cyclic prefix. The cyclic prefix length is assumed to be greater than L to avoid inter-symbol interference. Thus, H denotes the circulant channel matrix in (4) that can be decomposed as, $H=F^H \Lambda F$, where $H=\text{diag}(H)$, and $H=\sqrt{N}Fh$ is the DFT of the CIR. In reference to the receiver system 600 shown in FIG. 6, using the fact that the aforementioned circulant channel matrix can be decomposed, a DFT block 610 takes the DFT of both sides of (4), yielding, $$Y = \Lambda X_p + Z, \qquad (5)$$

where Y and Z are the DFT's of y and z respectively. As the present system and method is focused on nonlinear distortion estimation, the CIR is assumed to be perfectly known at the receiver. Thus, the frequency-domain received signal (after equalization performed by post DFT equalization block 620) is given by $$Y_{eq} = Fx_p + \Lambda^{-1}Z, \qquad (6)$$

where $Y_{eq} = \Lambda^{-1}Y$. Substituting the value of $x_p$ from (3) in (6) yields, $$Y_{eq} = Fx + Fx_d + Z_{col}, \qquad (7)$$

where $Z_{col}$ represents the AWGN noise colored by the inverse channel matrix. The time-domain equivalent of the received signal can thus be written as, $$y_{eq} = x + x_d + z_{col}, \qquad (8)$$

where $y_{eq}$ is the IDFT of $Y_{eq}$ and $z_{col}$ is the IDFT of $Z_{col}$. In the present OFDM telecommunication method, the overdrive linearized PA's distortions, $x_d$, are estimated using CS based techniques by exploiting the free carriers inserted in the OFDM symbol. Let w of cardinality |w|=N be the set of all carriers available in the OFDM symbol and $w_p \subset w$ of cardinality $|w_p|=P$ with P<N denoting the set of free or pilot carriers that will be used to estimate $x_d$. As we use CS-based techniques to estimate $x_d$, it is desirable for the P free carriers to be randomly placed and known to the receiver. Let D be the number of active tones used for data transmission with D=N−P and define $S_D$ as a binary selection matrix (of size N×D) with only one non-zero element equal to 1 per row and column that selects the data carriers and all zero rows with indices belonging to $w_p$. Then, the time-domain OFDM signal can be re-defined as $$X = F^H S_D X_D, \qquad (9)$$

where $X_D$ is the D×1 frequency-domain modulated data vector. The frequency-domain received signal (8) is thus modified as $$Y_{eq,D} = S_D X_D + Fx_d + Z_{col} \qquad (10)$$

Let us denote by $S_P$ the selection matrix (of size N×P) that spans the orthogonal complement of the columns of $S_D$ (i.e. $S_P$ is a binary matrix of size N×P with only one non-zero element equal to 1 per row and column and all zero rows with indices belonging to $(w-w_p)$). The distortion $x_d$ is estimated by projecting Y on $S_P^T$ as follows $$Y_{eq,D} = S_P^T Y_{eq} = S_P^T F x_d + Z_{col,p} \qquad (11)$$

where $Z_{col,p} = S_P^T Z_{col}$ is a Gaussian vector of length P. For notational convenience, we re-write the above equation as $$Y_p = \Psi_p x_d + Z_p \qquad (12)$$

where $\Psi_p \triangleq S_P^T F$ is a measurement matrix of size P×N. Note that (12) forms an under-determined system of linear equations as $x_d \in \mathbb{C}^N$ and $Y_p \in \mathbb{C}^P$ with P<N and hence cannot be solved by using the conventional linear techniques. This is in fact a typical CS problem when it is known a priori that the signal of interest $x_d$ is sparse. This problem can be solved by using the convex relaxation approach that solves an $l_1$-norm minimization problem using linear programming. Following the notation used, the problem can be casted as $$\text{minimize } \|x_d\|_1, \qquad (13)$$
$$\text{subject to } \|Y_P - \Psi_P x_d\|_2 \leq \grave{o},$$

where $\grave{o} = \sqrt{\sigma_z^2(P + \sqrt{2P})}$. It is important to mention here that the above convex relaxation approach used to estimate $x_d$ from (12) is exemplary only, but any other CS-based technique (for example, Bayesian methods and matching pursuits) can be utilized. After obtaining an estimate of the distortion $\hat{x}_d$ using CS block 640, an estimate of the distortion-free signal can be obtained by subtracting output of pre-DFT equalization block 630 from the distortion $\hat{x}_d$ at combiner 650 as follows, $$\hat{x} = y_{eq} - \hat{x}_d. \qquad (14)$$

The signal, $\hat{x}$ is then transformed by a DFT operation at DFT block 660 to the frequency-domain data signal, $\hat{X}$. Finally, this is demodulated at demodulation block 670 to obtain an estimate of the transmitted data, $\hat{d}$. If one has some a priori information related to the sparse signal $x_d$, an alternative approach to (13) called weighted CS (WCS) can be pursued by penalizing the less probable locations of $x_d$ as follows $$\text{minimize } \|w^T x_d\|_1, \qquad (15)$$
$$\text{subject to } \|Y_P - \Psi_P x_d\|_2 \leq \grave{o},$$

where w is a vector consisting of weights for each location in $x_d$. The major distortions caused by the linearized PA occur at the locations where the input amplitude is large. Accordingly, we can define w to be the inverse of the magnitude of the received signal $y_{eq}$, i.e., $$w(n) = \begin{cases} \frac{1}{|y_{eq}(n)|}, & y(n) \neq 0, \\ \infty, & y(n) = 0. \end{cases} \qquad (16)$$

where n={1, 2, . . . , N}. This way, the small entries in w correspond to the most probable locations where the overdriven DPD-PA combination might have distorted the signal and thus, this forces (15) to concentrate on them. One disadvantage of the previous algorithm is that a few carriers need to be reserved and be used for estimating the distortion. This causes a reduction in the available bandwidth. Alternatively, a data-aided CS algorithm can be used. This algorithm utilizes reliable data to aid in CS estimation. The advantages of the present iterative data-aided CS (DACS) algorithm include the fact that it enhances the performance of the CS/WCS algorithms while helping to increase the bandwidth efficiency of the system (by reducing the number of free or pilot carriers required) with a nominal increase in the receiver complexity. This algorithm is based on the assumption that even after the nonlinear distortions caused by the overdriven DPD-PA, a part of the data samples still remains within its corresponding decision regions. Let $W_R \subset w$ of cardinality $|w_R|=R$ denote the set of these carriers in which the perturbations are not severe i.e. the carriers are reliable. In other words, the noisy and perturbed data samples would remain in the decision regions of their respective constellation points, so that the following would hold with high probability;

$$\hat{X}_R = X_R, \qquad (17)$$

where $\hat{X}_R$ is the estimated data at the reliable carriers. Let $S_R$ be a binary selection matrix (of size N×R) with only one non-zero element equal to 1 per column that selects the reliable carriers. Multiplying both sides of (21) by $S_R^T$ yields, $$S_R^T Y_{eq} = S_R^T X + S_R^T F x_d + S_R^T Z_{col}, \qquad (18)$$

which, following the convention used in equations (11) and (12), can be written as $$Y_R = X_R + \Psi_R x_d + Z_R \qquad (19)$$

where $Y_R = S_R^T Y_{eq}$, $X_R = S_R^T X$, and $Z_R = S_R^T Z$. The perturbations, $\Psi_R x_d + Z_R$, at the reliable carriers do not push the data outside the reliable regions i.e., $$\lfloor Y_R \rfloor = X_R \tag{20}$$

where the $\lfloor \bullet \rfloor$ operator denotes rounding to the nearest neighbor. Thus, we can write (19) as $$Y_R - X_R = \Psi_R x_d + Z_R \tag{21}$$

or $$U_R = \Psi_R x_d + Z_R \tag{22}$$

where $U_R = Y_R - X_R$. It is important to note that it is not needed to determine all reliable carriers, $W_R$, rather, it is sufficient to determine a subset of these carriers, $w_{R'} \subset W_R$ and use them. Here onwards, R' is used to distinguish the variables corresponding to the subset $w_{R'}$, from the variables corresponding to the set $W_R$). The system of equations (22) can be solved using a CS-based approach similar to (13) as follows;

$$\text{minimize } \|x_d\|_1, \tag{23}$$
$$\text{subject to } \|U_R - \Psi_R x_d\|_2 \leq \delta,$$

The above procedure can be repeated $J_{max}$ times to further enhance the performance as shown in Table 1.

TABLE 1

Performance enhancement procedure block 702

| STEP | Procedure |
|---|---|
| 1 | Let $\tilde{X}^j$ be the $j^{th}$ estimated modulated data vector (obtained by taking the DFT 740 of $\hat{x}$). |
| 2 | Compare $\tilde{X}^j$ with the P size constellation points and obtain the R' reliable carriers at 755. |
| 3 | Find $S_{R'}$, $U_{R'}$, and $\Psi_{R'}$ based on R'. |
| 4 | Evaluate (23) to obtain $\hat{x}_d^j$ using 750 |
| 5 | Obtain $\hat{x}^{j+1} = \hat{x}^j - x_d^j$ by 735 |
| 6 | Repeat steps 2-5 till j = $J_{max}$ in 745 |

Figure 7:
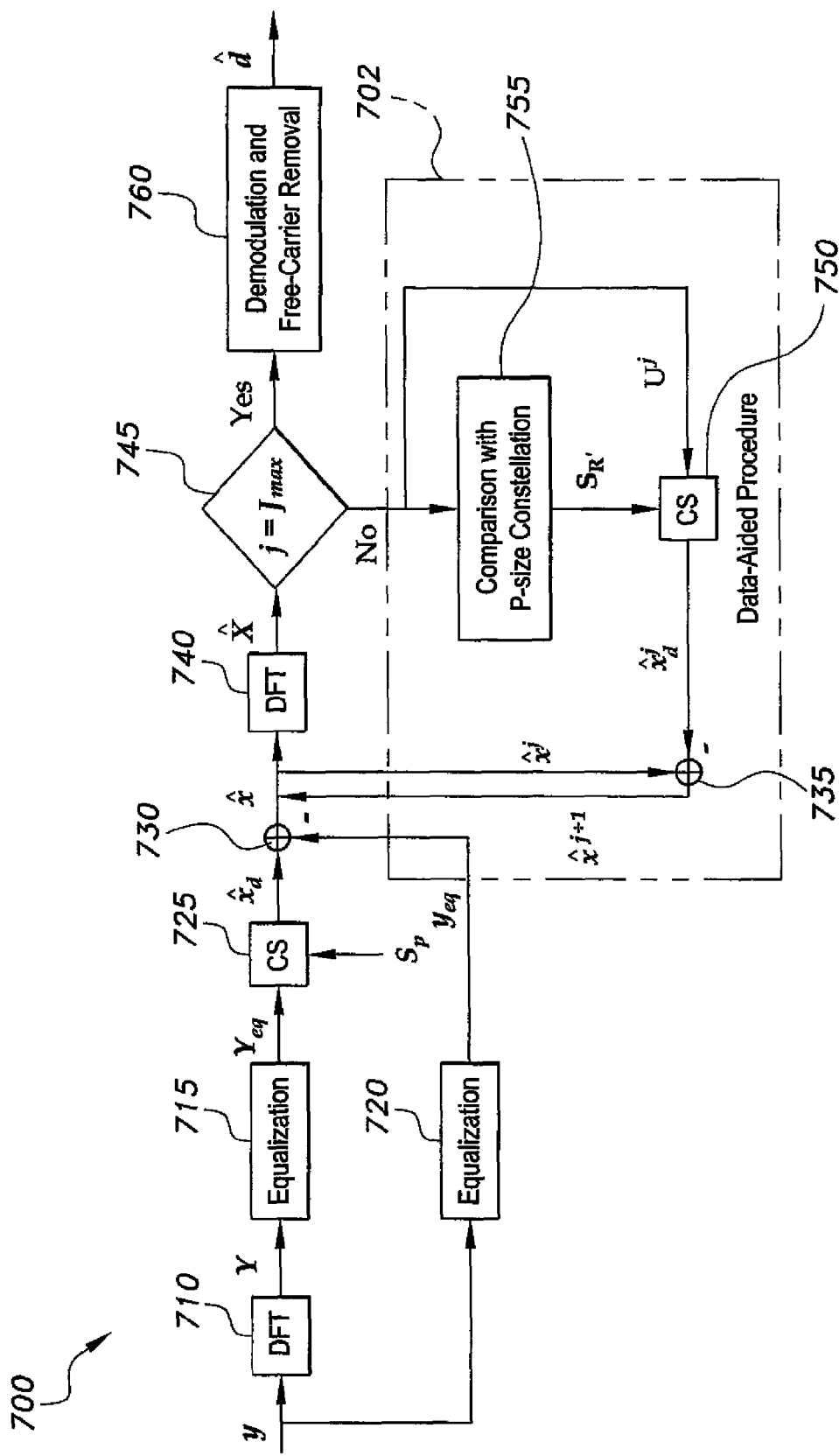
FIG. 7 is a block diagram of the CS-based distortion cancellation system implemented at the receiver according to the present invention.
Figure 8:
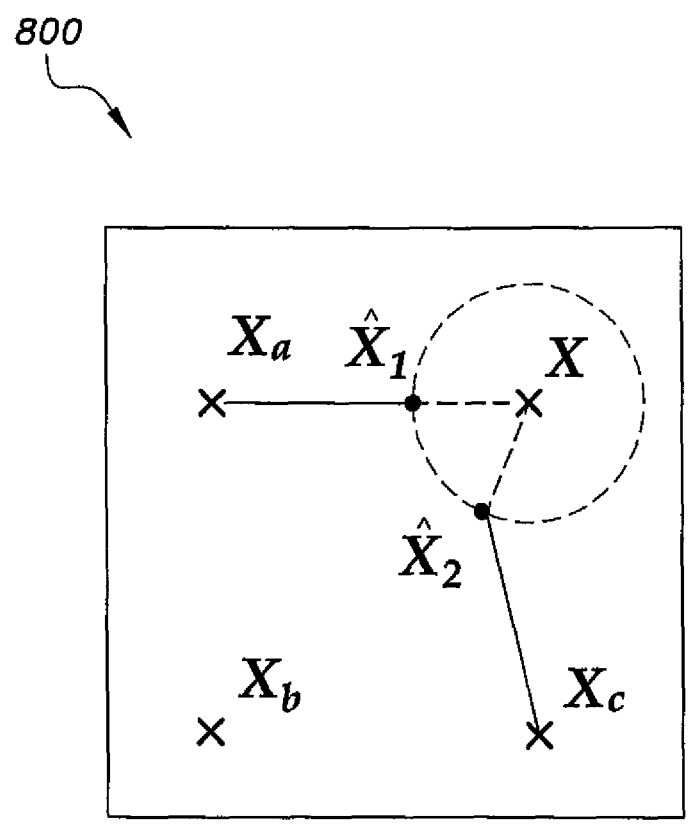
FIG. 8 is a pictorial diagram showing the signal relations according to the present invention.

FIG. 7 illustrates the receiver algorithms design 700 based on DACS algorithm. The blocks 710, 715, 720, 725, 730, 740 and 760 correspond to the blocks 610, 620, 630, 640, 650, 660, and 670, respectively. Note that the above procedure can also be applied to the case when no free carriers are used for CS estimation in the first iteration. In this case, the algorithm will highly rely on the set of reliable carriers available. To find the reliable set of carriers from the observed data, we pursue a geometrical approach. In order to explain the adopted approach, we consider as a motivating example the constellation 800 shown in FIG. 8. Here $\hat{X}_1$ and $\hat{X}_2$ are two equalized data samples which are equidistant from the closest constellation point, X. However, in spite of being equidistant from X, $\hat{X}_1$ and $\hat{X}_2$ have different reliability values. This is because the distances of these two points from their respective next nearest neighbors are different. Specifically, note that $X_a$ is next nearest neighbor of $\hat{X}_1$ and $X_c$ is next nearest neighbor of $\hat{X}_2$, respectively. Note also that, given that $\hat{X}_1$ and $\hat{X}_2$ are equidistant from X, it is clear that $\hat{X}_2$ is more reliable than $\hat{X}_1$ and in relative terms we have, $$\frac{|\hat{X}_2 - X|}{|\hat{X}_2 - X_c|} < \frac{|\hat{X}_1 - X|}{|\hat{X}_1 - \hat{X}_a|}, \tag{24}$$

This motivates the following reliability matrix $\Re$ (n), $$R = -\log\left(\frac{|\hat{X} - \lfloor \hat{X} \rfloor|}{|\hat{X} - \lfloor \hat{X} \rfloor_{NN}|}\right), \tag{25}$$

where, as defined before, $\lfloor \hat{X} \rfloor$ denotes rounding to the nearest constellation point, while $\lfloor \hat{X} \rfloor_{NN}$ denotes rounding to the next nearest constellation point. Thus, it is possible to calculate the reliability of all N−P carriers (or N carriers in the case when no free/pilot carriers are used), sort the reliabilities in descending order $\Re (n_1) \geq \Re (n_2) \geq \ldots \geq \Re (n_{N-P})$ and choose the R' carriers with the highest reliability $W_R = \{n_1, n_2, \ldots, n_{R'}\}$.

In the simulations presented, the number of subcarriers is fixed at N=256 and 64QAM modulation scheme is employed. The following two performance measures are used for comparing the present methods:

$$\text{Error Vector Magnitude } (EVM) = \sqrt{\frac{\frac{1}{N}\sum_{r=1}^{N}|X(r) - \hat{X}(r)|^2}{\frac{1}{N}\sum_{r=1}^{N}|X(r)|^2}}. \tag{26}$$

and $$\text{Symbol Error Rate } (SER) = \tag{27}$$
$$\frac{\Sigma \cdot \text{symbol errors (comparing } d \text{ and } \hat{d})}{\text{total number of symbols in } d}.$$

Both performance measures are plotted as functions of the signal to noise ratio (SNR) ranging from 15 dB to 35 dB. The SNR is given by:

$$SNR = \frac{\sigma_Z^2}{\sigma_{X_P}^2}, \tag{28}$$

where $\sigma_z^2$ and $\sigma_{x_p}^2$ are the variances of the noise and PA output signal, respectively.

Figure 9:
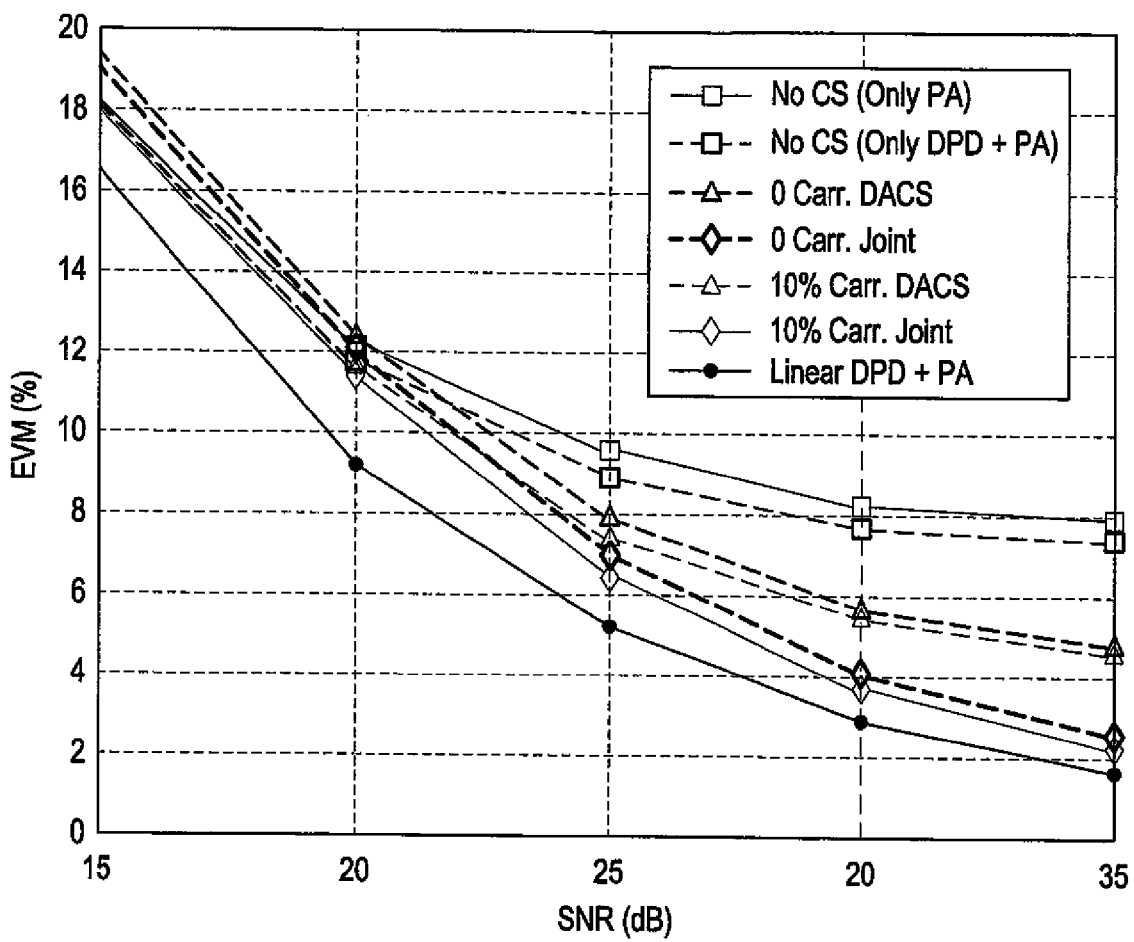
FIG. 9 is a plot showing EVM comparisons of the enhanced communication system to legacy communication systems.
Figure 10:
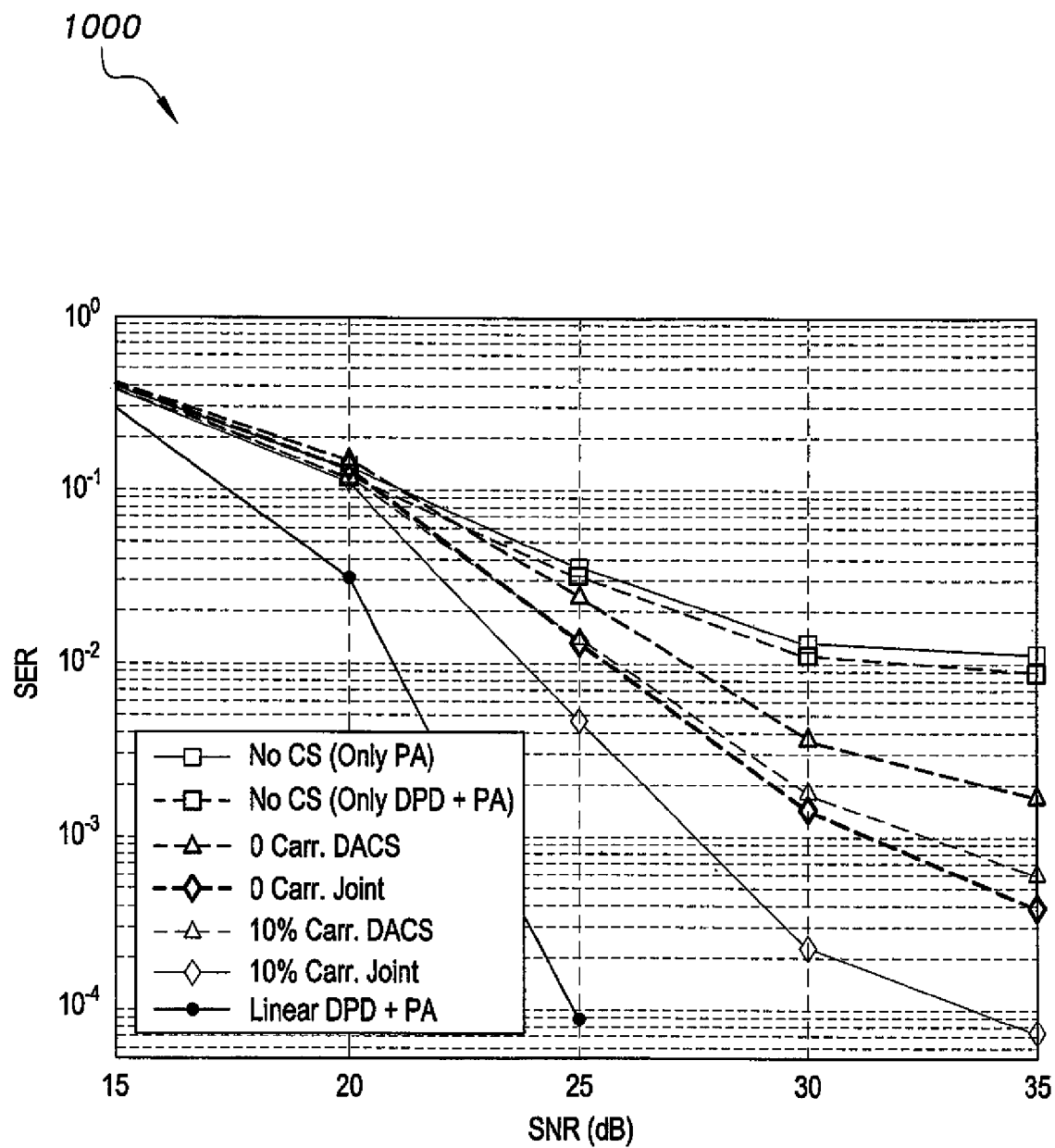
FIG. 10 is a plot showing SER comparisons of the enhanced communication system to legacy communication systems.

The performance of joint-compensation approach is compared with only post-compensating DACS in plot 900 of FIG. 9 and plot 1000 of FIG. 10. The number of reliable carriers and iterations for implementing DACS algorithm is fixed at R'=40% of N−P and $J_{max}$. It can be easily seen that joint-compensation performs better than DACS with post-compensation only. These figures also demonstrate the performance of the bandwidth efficient algorithm that uses no free carriers at all. It can be observed that the joint-compensation approach using no free carriers achieves a performance that is even better than post-compensating DACS with P=10% free carriers. According to the results shown in FIG. 9 and FIG. 10, CS makes it possible to overdrive the amplifier by up to 4 dB while compensating for the EVM. Accordingly, this results, for the tested amplifier, in an operating power added efficiency (PAE) of 40%. This represents 15% increase or 60% relative increase compared to the case where only digital predistortion is performed (i.e. PAE of 25%). This clearly demonstrates the effectiveness of the present joint-compensation technique to boost the operating power efficiency while maintaining low EVM and SER. This efficiency increase is critical for micro-satellite applications and military applications were the efficiency of the remote transmitter is a major concern. Advantages of the present invention are detailed in Table 2.

TABLE 2

Enhancement procedure advantages

| Advantage | Feature |
| --- | --- |
| 1 | uses joint-compensation between transmitter and receiver to improve transmitter's efficiency |
| 2 | Amplifier over-drive ensures power efficiency of the mobile terminal. |
| 3 | use of compressive sensing at the receiver improves EVM and SER performances. |
| 4 | use of DACS method ensures bandwidth efficient operation of the whole communication system |
| 5 | compensation at the receiver does not require prior knowledge of the transmitter and its nonlinearity |
| 6 | pre-compensation at the transmitter can be implemented by other means than digital pre-distortion |
| 7 | pre-compensation can be designed to fully or partly compensate for the nonlinearity of the amplifier prior to overdrive |
| 8 | post-compensation may be implemented by means other than CS |

It is to be understood that the present invention is not limited to the embodiments described above, but encompasses any and all embodiments within the scope of the following claims.

We claim:

1. In an orthogonal frequency division multiplexing (OFDM) telecommunication system having an OFDM transmitter sending OFDM signals amplified by a power amplifier to an OFDM receiver, a method for joint compensation (at the transmitter and the receiver) of the power amplifier's distortion, comprising the steps of:
(a) compensating distortion of the OFDM signals caused by the power amplifier at the transmitter;
(b) overdriving the linearized power amplifier to increase transmission power efficiency of the OFDM signals;
(c) estimating and further compensating the distortion of the OFDM signals using compressive sensing at the receiver, said compressive sensing being performed without reserving subcarriers specifically for said compressive sensing, thereby enhancing spectral efficiency of the OFDM signals; and
(d) using a priori knowledge about the sparsity of the overdrive distortion to recover the distortion introduced at the transmitter thereby facilitating the estimation and compensation step (c),
wherein the receiver performs the following steps:
iteratively estimating a modulated data vector until a maximum number, $j=J_{max}$, of modulated data vectors has been estimated;
iteratively comparing a $j^{th}$ estimated modulated data vector $U^j$ with a constellation of size P (P representing a number of data-free/pilot carriers) to produce a vector set of reliable carriers $S_R$;
iteratively performing compressive sensing based on inputs of the vector set of reliable carriers $S_R$, and the estimated modulated data vector $U^j$, output of the iterative compressive sensing providing $\hat{x}_d^j$;
subtracting said $\hat{x}_d^j$ from an $\hat{x}^j$ output of a front end compressive sensing and equalization step, said subtracting said $\hat{x}_d^j$ from said $\hat{x}^j$ forming a compensation signal $\hat{x}^{j+1}$;
performing a discrete Fourier transform (DFT) on the compensation signal $\hat{x}^{j+1}$ to provide an updated estimated modulated data vector $U^{j+1}$ as input to said iterative constellation comparison and iterative compressive sensing steps; and
demodulating and removing the data-free/pilot carriers of said enhanced, linearized OFDM signals when the maximum number, $j=j_{max}$, of modulated data vectors has been estimated.

2. An orthogonal frequency division multiplexing (OFDM) telecommunication system including an OFDM receiver, comprising:
a first discrete Fourier transform (DFT) block that accepts time domain OFDM free and data carrier signals as input, the first DFT block performing a discrete Fourier transform on the time domain OFDM free and data carrier signals;
a first channel equalizer, accepting the OFDM free and data carrier signals as input;
a second channel equalizer having an input operably connected to an output of the first DFT block;
a compressive sensing process block having an input operably connected to an output of the second channel equalizer, and an $S_p$ input, said $S_p$ input representing a binary selection matrix of size N×P where N is a total number of OFDM carrier signals presented at the receiver, and P is a number of pilot/data-free OFDM carrier signals presented at the receiver, distortion $x_d$ in said OFDM carrier signals being estimated by a projection of the second equalization block's output onto the selection matrix $S_p$;
a combiner having inputs operably connected to outputs of the compressive sensing process block, and the first channel equalizer, the combiner subtractively combining the compressive sensing process block output and the first channel equalizer output to provide an estimate $\hat{x}$ of the OFDM signals distortion free;
a second DFT block having an input operably connected to an output of the combiner; and
a demodulator having an input operably connected to an output of the second DFT block, the demodulator discarding the free carrier signals and demodulating the data carrier signals.

3. The OFDM telecommunication system according to claim 2, wherein the compressive sensing block comprises a solver using convex relaxation applied to an underdetermined system of equations presented by the projection of the second equalization block's output onto the selection matrix $S_p$ to provide the estimate of the distortion $x_d$.

4. The OFDM telecommunication system according to claim 2, further comprising a performance enhancement block operably connected to the second DFT block in a feedback path, wherein the performance enhancement block iteratively updates a $j^{th}$ estimated modulated data vector $\hat{X}^j$ output from the second DFT block until a stopping criterion is reached.

5. The OFDM telecommunication system according to claim 4, wherein the performance enhancement block further comprises:
a second compressive sensing block disposed in said feedback path;
a second combiner; and
a P-size constellation comparator feeding a first input of the second compressive sensing block, output of said second DFT block feeding a second input of the second compressive sensing block, output of the second compressive sensing block providing an enhanced distortion estimate, current distortion free estimate and enhanced distortion estimate being fed to the second combiner, the second combiner subtractively combining the estimates to provide an enhanced distortion free signal fed back to the input of the second DFT block, wherein $\hat{X}^j$ is compared with P size constellation points, R' reliable carriers being obtained therefrom.

6. The OFDM telecommunication system according to claim 5, wherein the second compressive sensing block includes a solver which evaluates a system of equations characterized by the relations, $$\text{minimize } \|x_d\|_1,$$
$$\text{subject to } \|U_R - \Psi_R x_d\|_2 \leq \hat{\delta},$$

where $\Psi_R x_d$ is a measurement matrix, and $U_R$ is the estimated data at the reliable carriers based on the R' reliable carriers.

7. The OFDM telecommunication system according to claim 5, wherein the stopping criteria is a maximum number of iterations $J_{max}$ performed by the performance enhancement block.

8. The OFDM telecommunication system according to claim 5, wherein the P-size constellation comparator comprises:
  means for calculating reliability of all N−P (if any) carriers; and
  means for sorting their reliabilities in descending order.

9. The OFDM telecommunication system according to claim 8, further comprising:
  an OFDM transmitter including an amplifier in an overdriven configuration that produces distortion in the OFDM free and data carrier signals transmitted to the OFDM receiver.

* * * * *